United States Patent [19]

Hamer et al.

[11] 3,859,723

[45] Jan. 14, 1975

[54] BONDING METHOD FOR MULTIPLE CHIP ARRAYS

[75] Inventors: Colin A. Hamer; Alberto Loro; John R. Payne, all of Ottawa, Ontario, Canada

[73] Assignee: Microsystems International Limited, Montreal 101, Quebec, Canada

[22] Filed: Nov. 5, 1973

[21] Appl. No.: 413,168

[52] U.S. Cl. .................. 29/626, 29/471.3, 29/203 J
[51] Int. Cl. .......................... B23k 19/00, H01l 7/00
[58] Field of Search ............ 29/471.1, 471.3, 576 S, 29/589, 626, 203 J, 203 P, 468; 206/330

[56] References Cited

UNITED STATES PATENTS

| | | | |
|---|---|---|---|
| 3,335,852 | 8/1967 | Soma | 206/330 |
| 3,533,155 | 10/1970 | Coucoulas | 29/47.13 X |
| 3,565,719 | 2/1971 | Webb | 29/589 X |
| 3,608,711 | 9/1971 | Wiesler | 206/330 X |
| 3,634,930 | 1/1972 | Cranston | 29/626 X |
| 3,658,618 | 4/1972 | Gramann | 29/589 X |
| 3,698,076 | 10/1972 | Kingsley | 29/589 X |
| 3,724,068 | 4/1973 | Galli | 29/626 |

*Primary Examiner*—Al Lawrence Smith
*Assistant Examiner*—K. J. Ramsey
*Attorney, Agent, or Firm*—S. T. Jelly

[57] ABSTRACT

A method of simultaneously or sequentially bonding a plurality of flip-chips to a metallization pattern on the surface of a substrate to form a multiple chip-array. By placing each of said plurality of flip-chip in corresponding apertures in metal template, and by fixing said flip-chips to said template with a high-temperature-resistant adhesive tape overlying the apertures in said template, the resulting assembly can be readily registered with a corresponding metallization pattern on the supporting surface of a substrate and thereafter said flip-chips can be either simultaneously or sequentially bonded to said metallization pattern.

20 Claims, 3 Drawing Figures

BONDING METHOD FOR MULTIPLE CHIP ARRAYS

This invention relates to a method of bonding a plurality of flip-chips to a substrate and more particularly to a method of simultaneously or sequentially bonding a plurality of flip-chips with precision and speed at predetermined location on a supporting substrate.

Many machines and methods have been developed to automate beam lead and bump terminal flip-chip bonding. In one automated method of thermo-compression bonding, flip-chips are accurately positioned on a pick-up table which indexes automatically under the bonding tool. After each flip-chip has been brought into a predetermined position under the bonding tool by indexing the pick-up table, and after the operator has checked the chip registration with its supporting substrate, each chip is individually bonded to said substrate. As each chip is usually registered and bonded individually to said substrate, a considerable amount of time is required to bond a multiple chip array, such as a large array of cross points, to said substrate even with present automated equipment and methods.

A method of rapidly bonding an array of flip-chips to a substrate has been devised, which does not require an expensive automatic bonding machine, and which facilitates handling of the flip-chips for said array as said flip-chips can be correctly oriented and positioned with respect to each other with the aid of a template at the chip sorting stage. Once the flip-chips have been positioned and secured to said template to form an assembly, said assembly can be used to hold said flip-chips in fixed juxtaposition during storage, shipping and subsequently during bonding of the flip-chips of said assembly to a metallization pattern on a substrate.

The proposed method can be used with flip-chips having bump terminals formed of solders, which are bonded to the substrate by fusing said bump terminals to the metallization pattern of the substrate, as well as with flip-chips having bump terminals designed for thermocompression bonding to the metallization pattern on the substrate. Furthermore the various flip-chips comprising a given assembly can be soldered or thermo-compression bonded either simultaneously or sequentially to the underlying substrate. The interested reader may find various references in the literature on bump terminals. In particular the I.B.M. Journal of Research and Development Vol. 13, No. 3 at pages 225–250 inclusive describes the use of solder bump terminals in the fabrication of hybrid circuits.

When, for example, the number of flip-chips in an assembly is large, and particularly when thermo-compression bonding is the chosen bonding method, it may be preferable to thermo-compression bond each flip-chip individually to said substrate while said flip-chips form part of said assembly. Because each flip-chip is accurately positioned at its intended location over the metallization pattern on said substrate by the initial alignment of the template to the substrate and subsequently held via said template at said intended location, as will be explained later in greater detail, the bonding tool need only be generally positioned over the flip-chip during subsequent individual bonding of the flip-chips to the substrate.

It can now be seen that a saving in time is realizable with the method of the present invention over conventional methods, even when the flip-chips are sequentially bonded. Most important, however, as all the flip-chips comprising an array of flip-chips can be simultaneously thermo-compression bonded or soldered to a corresponding metallization pattern on a substrate, a great saving in time can be realized, even without using expensive automatic bonding machines, by practising the method of the present invention.

Thus in accordance with the present invention there is provided a method of bonding a plurality of flip-chips, with predetermined orientations and at predetermined locations, to a metallization pattern on a supporting surface of a substrate, each flip-chip having a circuit face with bonding terminals thereon and a back face, said method comprising the steps of;

a. preparing a thin substantially flat metal template by adhering a flexible high-temperature-resistant tape to one surface of said template, said template being perforated by a plurality of substantially rectangular openings spaced and oriented in accordance with the desired spatial relationship and arrangement of the flip-chips on the supporting surface of said substrate, said template having a thickness less than the thickness of any one of said flip-chips, said tape overlying said openings to form a substantially rectangular pocket or well with an adherent bottom at each of said openings;

b. placing each of said plurality of flip-chips within a corresponding well in said template, with the back face of said each of said flip-chips in adherent contact with the adherent bottom of said corresponding well to form an assembly;

c. inverting said assembly and placing the other surface of said template over the supporting surface of the substrate;

d. registering said template with said substrate such that said plurality of flip-chips lie over said substrate at said predetermined locations whereat the bonding terminals of said flip-chips register with the metallization pattern on said substrate;

e. heating said metallization pattern and all the bonding terminals of a flip-chip and bonding said flip-chip to the metallization pattern on said substrate;

f. removing said tape from said one surface of said template and from the back faces of said flip-chips after all the flip-chips have been bonded to the metallization pattern on said substrate and thereafter withdrawing said template from said substrate.

An example method of practising the method of the present invention will now be described with reference to the accompanying drawings in which.

Figure 1:
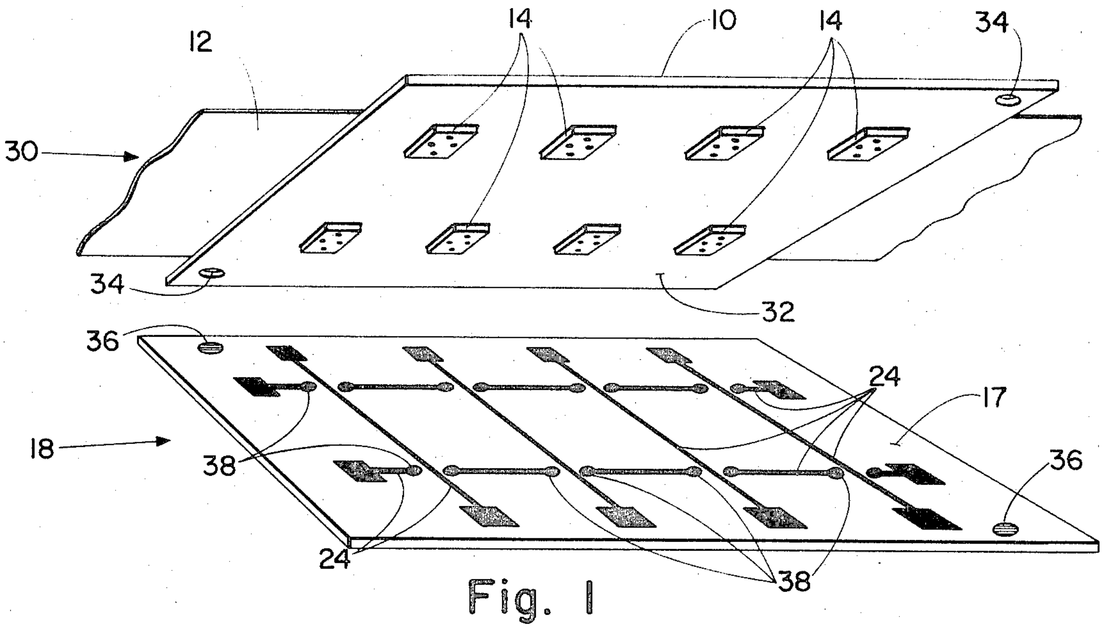
FIG. 1 is an exploded perspective view of a substrate with a metallization pattern thereon and an assembly comprising a template, with a plurality of flip-chips attached thereto.
Figure 2:
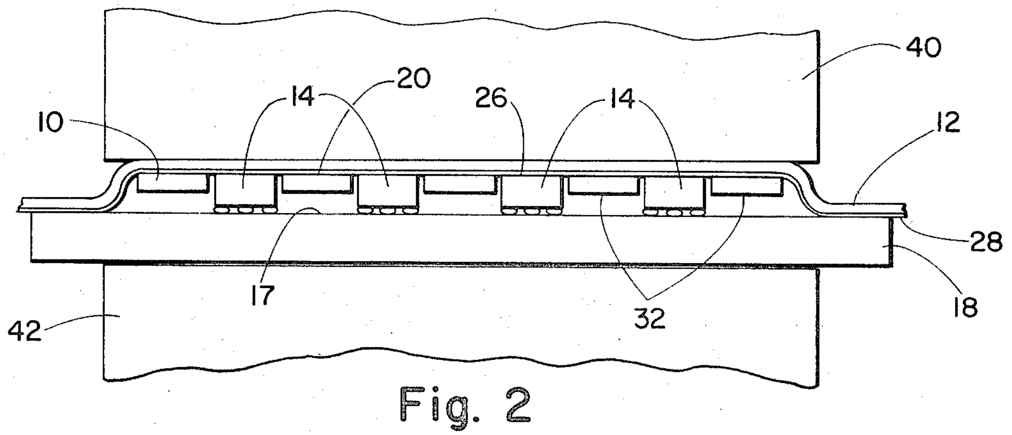
FIG. 2 is an assembled profile of the assembly of FIG. 1 positioned between the ramhead and work piece holder of a thermo-compression bonding machine.
Figure 3:
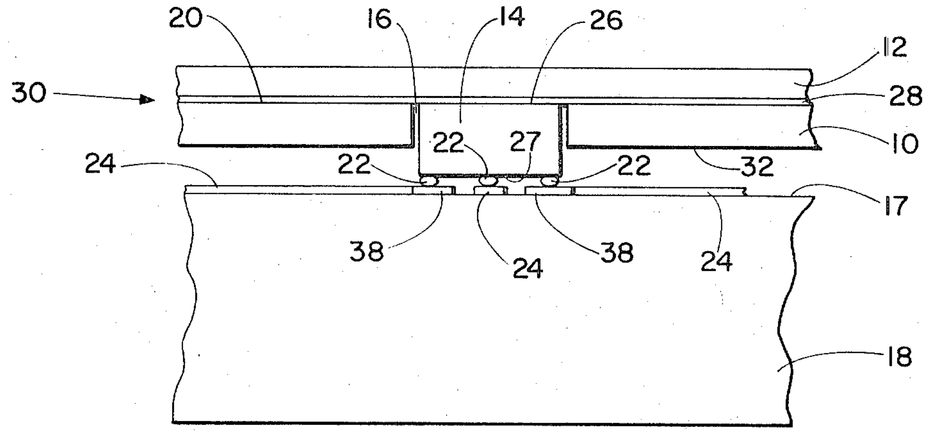
FIG. 3 is an enlarged view of a typical flip-chip and a portion of the assembly shown in FIG. 2.

Referring to FIGS. 1, 2 and 3, one method of bonding flip-chips to a substrate, in accordance with the present invention, is practised with the aid of a metal template 10 and a strip or piece of a flexible-high temperature-resistant plastic tape 12. The template 10 is perforated by a number of rectangular openings 16 which are spaced and oriented with respect to each other in accordance with the desired arrangement of flip-chips 14 on the supporting surface 17 of a substrate 18 to which said flip-chips 14 are to be bonded. The size of each rectangular opening 16 is slightly larger than the average outside dimensions of a flip-chip 14, and the thickness of the template 10 is slightly less than the thickness of the flip-chips 14. It is understood that the template 10 is custom made for each size of flip-chip and for each intended bonding arrangement.

As seen in FIG. 3 each flip-chip 14 is provided with bonding terminals 22 known in the industry as bump terminals. These bump terminals 22 may be either solder bump terminals or thermo-compression bump terminals. The substrate 18 is provided with a metallization pattern 24 which, for simplicity, is shown as a 4 by 2 matrix in FIG. 1. Furthermore, for simplicity, each flip-chip is provided with only four bump terminals 22.

Although the present example is drawn to a rather simple array of flip-chips, and although each flip-chip has only four bonding or bump terminals 22 thereon, it is understood that the present example is for illustration only and that the method of the present invention can be applied to larger arrays of flip-chips wherein each flip-chip is provided with more than four bump terminals.

For example, the method of the present invention has been used in one application to form a matrix of 64 diode crosspoints, arranged in 8 × 8 format over the supporting surface of a substrate.

The flexible high-temperature-resistant tape 12 may be either of a malleable metal or plastic composition, provided that the tape 12 can withstand the bonding temperatures and provided that said tape 12 is sufficiently compliant to distribute the bonding force (when simultaneous thermo-compression bonding is used) over all the flip-chips 14 which are intended to be simultaneously bonded. In practice a 3 mil polyimide tape formed of three layers of a 1 mil polyimide tape designated as type X-1205 manufactured by the 3M Company has been found to be suitable. Although three layers of a 1 mil tape were used, a single layer of 3 mil tape would have been used if it were readily available. The tape used should preferably be provided with an adhesive backing, although if an adhesive backing is not available a suitable adhesive may be applied during practice of the method as will be described later.

Although solder bump terminals are well known in the art, malleable bump terminals of the kind primarily intended to be used with one variation of the method of the present invention are not so well known. One form of bump terminal particularly suitable for the method of the present invention was invented by A. Loro and forms the subject matter of U.S. Pat. application Ser. No. 271,150 filed on July 12, 1972 under the title "Mounting Leads and Method of Fabrication." The bump terminals 22, described in the aforementioned patent application and as shown in the drawings, are a form of beam lead contained within the area of the flip-chip 14. These bump terminals comprise a flexible beam fastened at one end to the flip-chip 14 and terminating at the opposite end in a malleable metal bump. Because of their small size, for simplicity, these bump terminals are generally represented in the drawings by a small bump.

In practising the method of the present invention the flexible high-temperature-resistant tape 12 is first adhered to one surface 20 of the template 10, and flip-chips 14 are placed into the rectangular openings 16 in the template 10 such that the back face 26 of each flip-chip 14 is in adherent contact with the adhesive coating 28 on the high-temperature-resistant tape 12, to form an assembly 30.

Because the thickness of each flip-chips 14 is greater than the thickness of the template 10 (typically 8 mils and 5 mils respectively), each flip-chip 14 projects beyond the other surface 32 of the template as shown in the drawings. Once the flip-chips 14 have been oriented and placed in the rectangular openings 16 of the template 10 as aforesaid, the resulting assembly 30 can be flipped over, positioned and held over the metallization pattern 24 of the substrate 18, and bonded via said metallization pattern 24 to said substrate 18 without disturbing the orientation and arrangement of said flip-chips 14. To hold the assembly 30 in place over the substrate 18 prior to the bonding operation, said tape 12, which is sized so as to project beyond the periphery of the template 10, is pressed along its outer edges into adherent contact with the underlying supporting surface 17 of the substrate 18 as shown in FIG. 2. Alternatively, if desired, the assembly 30 and its corresponding substrate 18 fixed thereto can be stored, shipped or transported prior to bonding.

As shown in FIG. 1, the template 10 is provided with a pair of registration holes 34 which correspond to a pair of registration marks 36 on the supporting surface 17 of the substrate 18. When the registration holes 34 are aligned with the registration marks 36, the flip-chips 14 are positioned over the substrate 18 such that the bump terminals 22 of each flip-chip 14 register with corresponding lands 38 on the metallization pattern 24 on said substrate 18.

When it is desired to bond the flip-chips 14 of the assembly 30 to the substrate 18, the assembly 30 is placed over the supporting surface 17 of the substrate 18, such that the circuit face 27 of the flip-chips 14 comprising said assembly 30 and the other face 32 of the template 10 overlie the metallization pattern 24 on said supporting surface 17 of the substrate 18, and the registration holes 34 on the template 10 are aligned with the registration marks 36 on the supporting surface 17 of the substrate 18. After said template 10 has been correctly positioned over the supporting surface 17 of the substrate 18, said tape 12 is pressed into adherent contact with said supporting surface 17 to maintain registration as aforesaid. If the flip-chips 14 are provided with solder bump terminals 22 the solder bump terminals 22 on the flip-chips 14 contact corresponding lands 38 on the metallization pattern 24 on the supporting surface 17 of the substrate 18 while heat is applied to said substrate 18 or, to said substrate 18 and to said assembly 30, to fuse the solder bump terminals 22. Once the solder bump terminals 22 have wetted their corresponding lands 38 on the metallization pattern 24 on the supporting surface 17 of the substrate 18, the assembly 30 and the substrate 18 are allowed to cool sufficiently to bond said assembly 30 to said substrate 18. Following this bonding operation, the high-temperature-resistant tape 12 is removed from said one face 20 of the template 10, and from the back faces 26 of the flip-chips 14, to allow withdrawal of the template 10 from the substrate 18 and from the flip-chips 14 bonded thereto.

If the flip-chips 14 are provided with terminal bumps 22 designed for thermo-compression bonding a similar method is used, but a thermo-compression bonding machine or tool is used to heat both the substrate 18 and the assembly 30 and to apply a compressive force between the high-temperature-resistant tape 12 and the substrate 18 as shown in FIG. 2 of the drawings. Note, for simplicity, only the ramhead 40 and the work-piece holder 42 of the thermo-compression bonding tool are shown in FIG. 2. The high-temperature-resistant tape, not only serves to form an assembly 30 with the template 10 and flip-chips 14 as aforesaid but, also serves to more evenly distribute the force applied by the bonding tool over all the flip-chips 14 comprising said assembly 30. Because the bump terminals 22 lie within the area of each flip-chip 14 the application of a compressive force to the back face 26 of the flip-chip 14 is transferred to the bump terminals 22 on the circuit face 27 of said flip-chip 14 to perform the thermo-compression bonding operation.

Although the method described is particularly advantageous when used to simultaneously bond a plurality of terminals to a substrate, as described with reference to solder and thermo-compression bonding, a variation of the above described method can be used to sequentially bond the flip-chips 14 to the metallization pattern 24 on the substrate 18 which still provides savings in time over conventional individual, or chip-by-chip, bonding methods.

In particular, after the critical alignment between the individual flip-chips 14 and the metallization pattern 24 on the substrate 18 has been established by registering the template 10 with the substrate 18, and after the assembly 30 has been secured to the substrate 18 as aforesaid, the flip-chips 14 may be individually or sequentially thermo-compression bonded to the metallization pattern 24 on the substrate 18. In this variation of the earlier described methods, the ramhead 40 of the thermo-compression bonding tool would be considerably smaller than the ramhead required for simultaneous bonding. The thermo-compression bonding operation could be rapidly performed by sequentially placing individual flip-chips generally under the bonding tool as the individual flip-chips would already be in precise alignment with the underlying metallization pattern.

In the application previously referred to, wherein a matrix of 64 diode crosspoints arranged in 8 × 8format were thermo-compression bonded to the supporting surface of a substrate, the following temperatures, pressure and time were used:

Temperature of ramhead of bonding machine approximately 500° C.

Temperature of base or work piece holder of bonding machine 450° C to 475° C.

Thermo-compression bonding pressure on each bump terminal approximately $6.4 \times 10^6$ gms/cm$^2$.

Thermo-compression bonding time approximately 10 seconds.

What is claimed is:

1. A method of bonding a plurality of flip-chips, with predetermined orientations and at predetermined locations, to a metallization pattern on a supporting surface of a substrate, each flip-chip having a circuit face with bonding terminals thereon and a back face, said method comprising the steps of;

a. preparing a thin substantially flat metal template by adhering a flexible high-temperature-resistant tape to one surface of said template, said template being perforated by a plurality of substantially rectangular openings spaced and oriented in accordance with the desired spatial relationship and arrangement of the flip-chips on the supporting surface of said substrate, said template having a thickness less than the thickness of any one of said flip-chips, said tape overlying said openings to form a substantially rectangular pocket or well with an adherent bottom at each of said openings;

b. placing each of said plurality of flip-chips within a corresponding well in said template, with the back face of said each of said flip-chips in adherent contact with the adherent bottom of said corresponding well to form an assembly;

c. inverting said assembly and placing the other surface of said template over the supporting surface of the substrate;

d. registering said template with said substrate such that said plurality of flip-chips lie over said substrate at said predetermined locations whereat the bonding terminals of said flip-chips register with the metallization pattern on said substrate;

e. heating said metallization pattern and all the bonding terminals of a flip-chip and bonding said flip-chip to the metallization pattern on said substrate;

f. removing said tape from said one surface of said template and from the back faces of said flip-chips after all the flip-chips have been bonded to the metallization pattern on said substrate and thereafter withdrawing said template from said substrate.

2. A method of thermo-compression bonding a plurality of flip-chips, with predetermined orientations and at predetermined locations, to a metallization pattern on a supporting surface of a substrate, each flip-chip having a circuit face with bump terminals thereon and a back face, said method comprising the steps of;

a. preparing a thin substantially flat metal template by adhering a flexible high-temperature-resistant tape to one surface of said template, said template being perforated by a plurality of substantially rectangular openings spaced and oriented in accordance with the desired spatial relationship and arrangement of the flip-chips on the supporting surface of said substrate, said template having a thickness less than the thickness of any one of said flip-chips, said tape overlying said openings to form a substantially rectangular pocket or well with an adherent bottom at each of said openings;

b. placing each of said plurality of flip-chips within a corresponding well in said template, with the back face of said each of said flip-chips in adherent contact with the adherent bottom of said corresponding well to form an assembly;

c. inverting said assembly and placing the other surface of said template over the supporting surface of the substrate;

d. registering said template with said substrate such that said plurality of flip-chips lie over said substrate at said predetermined locations whereat the bump terminals of said flip-chips register with the metallization pattern on said substrate;

e. applying a compressive force between said substrate and said tape to press all the bump terminals on the circuit face of a flip-chip into intimate contact with the metallization pattern on the supporting surface of said substrate while heating said metallization pattern and all said bump terminals to thermo-compression bond said flip-chip to the metallization pattern on said substrate.

3. A method of solder bonding a plurality of flip-chips, with predetermined orientations and at predetermined locations, to a metallization pattern on a supporting surface of a substrate, each flip-chip having a circuit face with solder bump terminals thereon and a back face, said method comprising the steps of;

a. preparing a thin substantially flat metal template by adhering a flexible high-temperature-resistant tape to one surface of said template, said template being perforated by a plurality of substantially rectangular openings spaced and oriented in accordance with the desired spatial relationship and arrangement of the flip-chips on the supporting surface of said substrate, said template having a thickness less than the thickness of any one of said flip-chips, said tape overlying said openings to form a substantially rectangular pocket or well with an adherent bottom at each of said openings;

b. placing each of said plurality of flip-chips within a corresponding well in said template, with the back face of said each of said flip-chips in adherent contact with the adherent bottom of said corresponding well to form an assembly;

c. inverting said assembly and placing the other surface of said template over the supporting surface of the substrate;

d. registering said template with said substrate such that said plurality of flip-chips lie over said substrate at said predetermined locations whereat the solder bump terminals of said flip-chips register with the metallization pattern on said substrate;

e. heating said metallization pattern and all the solder bump terminals of a flip-chip to fuse said solder bump terminals to the metallization pattern on said substrate;

f. removing said tape from said one surface of said template and from the back faces of said flip-chips after all the flip-chips have been bonded to the metallization pattern on said substrate and thereafter withdrawing said template from said substrate.

4. The method as defined in claim 1 wherein all the bonding terminals of said plurality of flip-chips and the metallization pattern on said substrate are simultaneously heated, and said flip-chips are simultaneously bonded to said metallization pattern.

5. The method as defined in claim 2 wherein all the bonding terminals of said plurality of flip-chips and the metallization pattern on said substrate are simultaneously heated, and said flip-chips are simultaneously bonded to said metallization pattern.

6. The method as defined in claim 3 wherein all the bonding terminals of said plurality of flip-chips and the metallization pattern on said substrate are simultaneously heated, and said flip-chips are simultaneously bonded to said metallization pattern.

7. The method as defined in claim 1 wherein said plurality of flip-chips are sequentially bonded to the metallization pattern on said substrate by simultaneously heating said metallization pattern and all the bonding terminals of each flip-chip selected for each bonding operation.

8. The method as defined in claim 2 wherein said plurality of flip-chips are sequentially bonded to the metallization pattern on said substrate by simultaneously heating said metallization pattern and all the bonding terminals of each flip-chip selected for each bonding operation.

9. The method as defined in claim 1 wherein the flexible high-temperature-resistant tape has a plastic composition.

10. The method as defined in claim 2 wherein the flexible high-temperature-resistant tape has a plastic composition.

11. The method as defined in claim 2 wherein the flexible high-temperature-resistant tape is a polyimide tape.

12. The method as defined in claim 2 wherein the flexible-high-temperature-resistant tape is a polyimide tape with an adhesive coating.

13. The method as defined in claim 2 wherein the flexible high-temperature-resistant tape has a malleable metal composition.

14. The method as defined in claim 2 wherein the flexible high-temperature-resistant tape has a malleable metal composition and an adhesive coating.

15. The method as defined in claim 1 wherein the bonding terminals on the circuit face of each flip-chip are bump terminals.

16. The method as defined in claim 2 wherein all the bump terminals of said plurality of flip-chips are simultaneously thermo-compression bonded to the metallization pattern on said substrate, and wherein the flexible high-temperature resistant tape is a polyimide tape with an adhesive coating.

17. The method as defined in claim 16 wherein the temperature of the assembly during the bonding operation is about 450° centigrade, and wherein a pressure of approximately $6 \times 10^6$ gms/cm$^2$ is maintained for approximately 10 seconds at the bump terminals for the bonding operation.

18. The method as defined in claim 1 wherein said tape extends beyond said one surface of said template and wherein said template is held in registration with said substrate, such that said plurality of flip-chips overlie said substrate at said predetermined locations, by adhering a portion of said tape extending beyond said one surface of said template to the supporting surface of said substrate.

19. The method as defined in claim 2 wherein said tape extends beyond said one surface of said template and wherein said template is held in registration with said substrate, such that said plurality of flip-chips overlie said substrate at said predetermined locations, by adhering a portion of said tape extending beyond said one surface of said template to the supporting surface of said substrate.

20. The method as defined in claim 3 wherein said tape extends beyond said one surface of said template and wherein said template is held in registration with said substrate, such that said plurality of flip-chips overlie said substrate at said predetermined locations, by adhering a portion of said tape extending beyond said one surface of said template to the supporting surface of said substrate.

* * * * *